United States Patent
Lysaght

(10) Patent No.: US 8,415,974 B1
(45) Date of Patent: Apr. 9, 2013

(54) METHODS AND CIRCUITS ENABLING DYNAMIC RECONFIGURATION

(75) Inventor: Patrick Lysaght, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/044,158

(22) Filed: Mar. 9, 2011

(51) Int. Cl.
*H03K 19/177* (2006.01)

(52) U.S. Cl.
USPC .................................. 326/39; 326/41; 326/47

(58) Field of Classification Search .......................... None
See application file for complete search history.

(56) References Cited

U.S. PATENT DOCUMENTS

| | | | |
|---|---|---|---|
| 6,326,806 B1 * | 12/2001 | Fallside et al. | 326/38 |
| 6,429,682 B1 | 8/2002 | Schultz et al. | |
| 6,625,794 B1 | 9/2003 | Trimberger | |
| 7,218,137 B2 * | 5/2007 | Vadi et al. | 326/38 |
| 7,227,378 B2 | 6/2007 | Blodget et al. | |
| 7,254,800 B1 | 8/2007 | Trimberger | |
| 7,535,254 B1 * | 5/2009 | Case | 326/39 |
| 7,539,926 B1 | 5/2009 | Lesea | |
| 8,099,625 B1 | 1/2012 | Tseng et al. | |
| 2009/0219051 A1 * | 9/2009 | Zhang et al. | 326/38 |

OTHER PUBLICATIONS

Carmichael, Carl et al., *Correcting Single-Event Upsets Through Virtex Partial Configuration*, XAPP216 (v1.0), Jun. 1, 2000, pp. 1-12, Xilinx, Inc., San Jose, California, USA.
Xilinx, Inc., *Virtex-6 FPGA Configuration User Guide*, UG360 (v3.0), Jan. 18, 2010, pp. 1-174, Xilinx, Inc., San Jose, California, USA.
Xilinx, Inc., *Virtex-6 FPGA Configuration User Guide*, UG360 (v3.2), Nov. 1, 2010, pp. 1-180, Xilinx, Inc., San Jose, California, USA.

* cited by examiner

*Primary Examiner* — Crystal L Hammond
(74) *Attorney, Agent, or Firm* — John J. King

(57) ABSTRACT

A method of enabling partial reconfiguration in a device having configurable resources is disclosed. The method comprises receiving a configuration bitstream comprising configuration bits; configuring the configurable resources of the device using the configuration bits of the configuration bitstream; receiving a request for a partial reconfiguration of the device; loading updated configuration bits into memory elements associated with a portion of the configurable resources in response to the request for a partial reconfiguration; and providing a status of the partial reconfiguration while loading the updated configuration bits. A circuit for enabling partial reconfiguration in a device having configurable resources is also disclosed.

18 Claims, 11 Drawing Sheets

| Region 1 | Region 2 | Region 3 | Region 4 | Region 5 |
|---|---|---|---|---|
| Task 1,1 | Task 2,1 | Task 3,1 | Task 4,1 | Task 5,1 |
| Task 1,2 | Task 2,2 | Task 3,2 | Task 4,2 | Task 5,2 |
| Task 1,3 | Task 2,3 | Task 3,3 | Task 4,3 | Task 5,3 |
| Empty 1 | Task 2,4 | Task 3,4 | Task 4,4 | Task 5,4 |
|  | Task 2,5 | Empty 3 | Task 4,5 | Task 5,5 |
|  | Task 2,6 |  | Task 4,6 | Task 5,6 |
|  |  |  |  | Task 5,7 |

FIG. 12

| Region 1 | Region 2 | Region 3 | Region 4 | Region 5 |
|---|---|---|---|---|
| Task 1,1 | Task 2,1 | Task 3,1 | Task 4,1 | Task 5,1 |
|  | Task 2,2 | Task 3,2 | Task 4,2 | Task 5,2 |
|  |  | Task 3,3 | Task 4,3 | Task 5,3 |
|  |  | Task 3,4 | Task 4,4 | Task 5,4 |
|  |  | Empty 3 | Task 4,5 | Task 5,5 |
| Task 1,2 |  | Task 3,1 | Task 4,1 | Task 5,1 |
|  |  | Task 3,2 |  | Task 5,2 |
|  | Task 2,3 | Task 3,3 | Task 4,3 |  |
|  | Task 2,4 | Task 3,4 | Task 4,4 |  |
|  |  |  | Task 4,5 |  |
|  | Task 2,6 |  | Task 4,6 | Task 5,6 |
|  |  |  |  | Task 5,7 |

FIG. 13

METHODS AND CIRCUITS ENABLING DYNAMIC RECONFIGURATION

FIELD OF THE INVENTION

The present invention relates generally to integrated circuits, and in particular, to a method of and circuit for enabling a dynamic reconfiguration in a device having configurable resources.

BACKGROUND

Integrated circuits having programmable resources are designed to enable users to implement logic designs of their choice. Programmable resources may comprise gates which are configurable by a user of the circuit to implement a circuit design of the user. For integrated circuits having programmable resources, the functionality of the integrated circuit is controlled by configuration data bits of a configuration bitstream provided to the integrated circuit. These integrated circuits typically have different modes depending on the operations being performed on them, where a specific protocol allows the integrated circuit to enter into the appropriate mode. During a "program" mode, a configuration bitstream is provided to non-volatile memory associated with the integrated circuit. During system power up of a "startup" mode, the configuration bits are successively loaded from the non-volatile memory into static random access memory (SRAM) configuration latches of configuration logic blocks.

Conventional integrated circuits having programmable resources also enable partial reconfiguration. Work has been done on the specification and synthesis of such integrated circuits. For example, design and verification for capturing dynamically reconfigurable behavior has been performed. Further, the synthesis of a reconfiguration controller from a system specification has been reported. However, such systems have considerable disadvantages.

SUMMARY

A method for a device having configurable resources is disclosed. The method comprises receiving a configuration bitstream comprising configuration bits; configuring the configurable resources of the device using the configuration bits of the configuration bitstream; receiving a request for a partial reconfiguration of the device; loading updated configuration bits into memory elements associated with a portion of the configurable resources in response to the request for a partial reconfiguration; and providing a status of the partial reconfiguration while loading the updated configuration bits.

According to some embodiments, receiving a request for a partial reconfiguration may comprise receiving a request from a circuit within the device having configurable resources or from a device external to the device having configurable resources. Receiving a request for a partial reconfiguration may comprise receiving a request by way of a port for providing the status of the partial reconfiguration. Providing a status of the partial reconfiguration may comprise providing a status of the partial reconfiguration by way of a DONE output port. The method may further comprise periodically updating the status of the partial reconfiguration, wherein providing a status of the partial reconfiguration comprises providing a phase of the partial reconfiguration. The method may further comprise identifying at least one of a task which is being removed and a task which is being added comprises identifying tasks associated with predetermined regions of the configurable resources.

According to an alternate embodiment, a method for a device having configurable resources comprises receiving a configuration bitstream comprising configuration bits; configuring the configurable resources of the device using the configuration bits of the configuration bitstream; receiving a request for a partial reconfiguration of the device; loading updated configuration bits into memory elements associated with a portion of the configurable resources in response to the request for a partial reconfiguration; and generating reconfiguration status information comprising at least one of a task which is being removed and a task which is being added.

Generating reconfiguration status information may comprise identifying tasks associated with predetermined regions of the configurable resources which are being added. The method may further comprise identifying a phase of the partial reconfiguration. The method may also comprise extracting information from the design specification to enable synthesizing a circuit for generating the reconfiguration status information and extracting information related to tasks. Loading updated configuration bits may comprise pre-empting a task with a higher priority task. The method may further comprise re-implementing the pre-empted task by re-starting the pre-empted task from a state captured while pre-empting the task.

An integrated circuit device comprises memory elements storing configuration bits; configurable resources coupled to the memory elements, the configuration bits implementing a circuit in the configurable resources; a configuration circuit coupled to the memory elements, the configuration circuit enabling a partial reconfiguration of the configurable resources; and a first input/output port coupled to the configuration circuit, wherein a status of the partial reconfiguration is provided by the configuration circuit by way of the first input/output port.

The configuration circuit of the integrated circuit device may receive a request for a partial reconfiguration by way of the first input/output port. The integrated circuit device may further comprise a second input/output port coupled to receive a configuration bitstream, and a third input/output port coupled to receive a reconfiguration request. The configuration circuit may comprise a reconfiguration controller, the reconfiguration controller identifying a phase of the partial reconfiguration. The status of the configurable resources may be provided between partial reconfigurations of the integrated circuit device.

BRIEF DESCRIPTION OF THE DRAWINGS

FIG. 12 is a table showing regions and associated sets of valid, mutually-exclusive circuit assignments of programmable resources according to an embodiment;

FIG. 13 is a table showing subsets of valid task permutations across regions of programmable resources according to an alternate embodiment;

DETAILED DESCRIPTION

Figure 1:
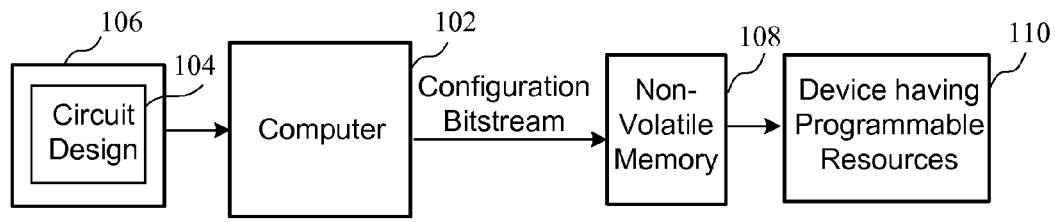
FIG. 1 is a block diagram of a system for configuring a device having programmable resources according to an embodiment.

Turning first to FIG. 1, a block diagram of a system for configuring a device having programmable resources according to an embodiment is shown. In particular, a computer 102 is coupled to receive a circuit design 104 from a memory 106, and generate a configuration bitstream which is stored in the non-volatile memory 108. As will be described in more detail below, the circuit design may be a high level design, such as a circuit design defined in a hardware description language (HDL) such as VHDL. Also, the computer may be configured to run software that generates a configuration bitstream which is stored in the non-volatile memory 108. As will be described in more detail below, the configuration bitstream is loaded into an integrated circuit device 110 having programmable resources. The device having programmable resources may be a programmable logic device (PLD) or an application specific integrated circuit (ASIC) having a portion implemented as programmable resources.

The software flow for the circuit design to be implemented in a device having programmable resources may comprise synthesis, packing, placement and routing, as is well known in the art. Synthesis enables converting a circuit design represented by a high level design to a configuration of elements found in a device. For example, a synthesis tool operated by the computer 102 may implement the portions of a circuit design representing various functions in certain blocks of the device, such as configurable logic blocks (CLBs) or digital signal processing (DSP) blocks, for example. Placing enables determining the location of the blocks of the device defined during packing. Finally, routing comprises selecting paths of interconnect elements, such as programmable interconnects, as will be described in more detail below. At the end of place and route, all functions, positions and connections are known, and a configuration bitstream is then created for at least booting the device. An example of a tool enabling the generation of a bitstream is the ISE tool available from Xilinx, Inc. of San Jose Calif. Packing enables grouping portions of the circuit design into defined blocks of the device, such as CLBs or DSPs. However, as will be described in more detail below, the circuits and methods enable scheduling tasks and partial reconfigurations to update tasks during runtime.

Figure 2:
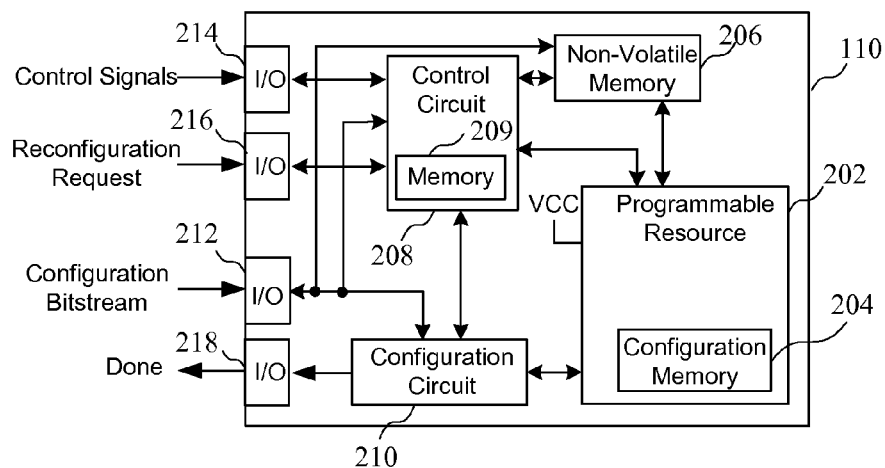
FIG. 2 is a block diagram of the device having programmable resources of FIG. 1 according to an embodiment.
Figure 3:
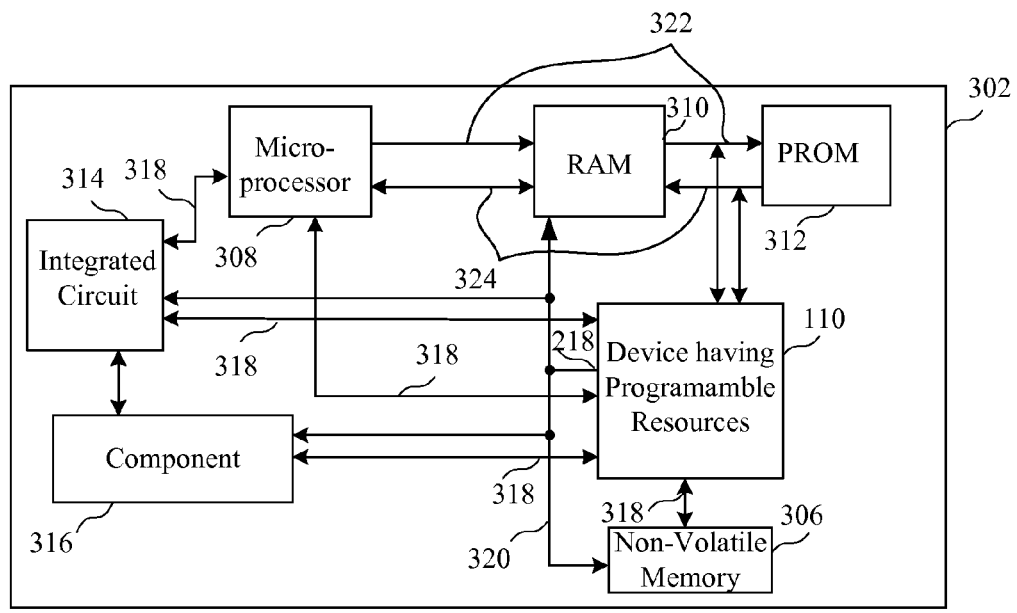
FIG. 3 is a block diagram of a system implementing the device having programmable resources of FIG. 2 according to an embodiment.

Turning now to FIG. 2, a block diagram of the integrated circuit device 110 having programmable resources according to an embodiment is shown. In particular, programmable resources having associated configuration memory 204 enable the programmable operation of the integrated circuit device 110. The configuration memory 204 of the integrated circuit device 110 is programmed using bitstreams typically held in non-volatile storage elements, such as non-volatile memory 206. However, it should be understood that the non-volatile memory 206, while shown internal to the device, may be external to the device as shown in FIG. 3 for example. The device may comprise a control circuit 208 having a cache memory 209 enabling the operation of circuits implemented in the programmable resources. The control circuit may be coupled to a configuration circuit 210. As will be described in more detail below, the configuration circuit will enable the configuration and reconfiguration of the programmable resources.

Various signals are provided to the device to enable the operation and the reconfiguration of circuits implemented in the programmable resources. In particular, a configuration bitstream is received by way of an input/output (I/O) port 212. The configuration bitstream could be a configuration bitstream for an initial configuration of the device, which may be a full or a partial reconfiguration, or a portion of a bitstream for a partial reconfiguration to update tasks as will be described in more detail below. Control signals may also be provided by way of an I/O port 214. The control signals may instruct the control circuit 208 to perform a certain function. While a request for a reconfiguration may be generated internally to the integrated circuit device 110, a reconfiguration request may be received from an external device by way of an I/O port 216. Finally, a DONE signal is generated at an I/O port 218. While the I/O port 216 may be a single pin limited to generating a DONE signal in conventional devices, a monitor/debug port according to various embodiments set forth below may be associated a conventional "done" port for sending serial data, or may be a multi-pin port for transmitting status information by way of multiple pins. It should be understood that while a conventional done port only provides the functionality of sending a done signal, the monitor/debug port according to various embodiments set forth below may be a bi-directional port which also receives signals, such as an external request for a partial reconfiguration. While four I/O ports are shown, it should be understood that many other I/O ports may be implemented in the integrated circuit 110. Further, the various I/O ports associated with configuring the device shown in FIG. 2 could be implemented as a part of a single, multi-pin monitor/debug port. The operation of the integrated circuit device 110 in response to various signals in a system will be described in more detail below in reference to FIG. 3.

The configuration bitstream contains the information required to configure a given integrated circuit device having programmable resources to implement its intended function. With current technology, it is feasible to reconfigure regions of a device while the operation of others regions continues undisturbed. Such a reconfiguration is commonly called partial, dynamic reconfiguration. When reconfiguring a device, the principal feedback mechanism indicating a successful conclusion of the reconfiguration operation is the state of a DONE signal at an I/O port. According to the various embodiments set forth below, the I/O port generating the DONE signal becomes a monitor/debug port (MDP) for providing reconfiguration status information during dynamic partial reconfiguration. As will be described in more detail below, the monitor/debug port will report, in real-time, a detailed status of the progress of reconfiguration. Such a status is particularly significant for the most advanced applications involving dynamic, partial reconfiguration.

With a standardized port and communication protocol, the implementation of dynamic designs can be augmented to generate the necessary reconfiguration status information comprising monitoring and debug information. The port would be used both when initially implementing the design, and post implementation in the field during maintenance and repair. In order to maximize performance, the physical and logic communication is standardized so that any system implementing the device which is dynamically reconfigured will be able to process the reconfiguration status information from the configuration circuit. Further, system parameters describing dynamic behavior may be automatically extracted from the design specification. That is, the configuration bitstream having the design specification will include information indicating the level of monitoring of the reconfiguration process. Also, the software and hardware components necessary to communicate reconfiguration status information by way of the monitor/debug port are synthesized. That is, based upon the level of monitoring required in the reconfiguration process, the circuits necessary to enable feedback of the reconfiguration status information during partial reconfiguration will be synthesized so that the circuits will be implemented during the full, initial configuration of the device. While any necessary circuits for monitoring and debugging during a partial reconfiguration may be implemented using programmable resources of the device, the device may be implemented using a hard circuit for monitoring and debugging, or a combination of hard circuits and programmable resources.

A dynamically reconfigurable design implemented in an integrated circuit device exhibits, at the highest level, three "super" states. These super states include an initial boot operation, normal operation without any reconfiguration progress, and normal operation with dynamic reconfiguration. During normal operation with dynamic reconfiguration, the device may operate in many constituent states. The reconfiguration status information associated with these constituent states may include information identifying what region is being reconfigured, or information identifying what task or circuit is being removed and/or what task or circuit is being loaded, for example. The reconfiguration status information may also include the phase of a reconfiguration cycle of the integrated circuit device. Some phases of a reconfiguration cycle may include a reconfiguration request phase, a request acknowledgement phase, a request scheduled phase, a reconfiguration initiated phase, a reconfiguration successful phase, a task state loaded phase, and a task operation initiated phase, for example.

The circuit providing reconfiguration status information by way of the monitor/debug port should enable real-time monitoring. While it might be possible to provide reconfiguration status information on a relatively slow, serial interface such as a Joint Test Action Group (JTAG) port, it would be preferable to have a higher speed interface that could support real-time diagnostic information. The monitor/debug port may be either serial or parallel as long as the data can be recovered in real-time. As will be described in more detail below in reference to FIG. 4, some circuits of the device having programmable resources may be implemented in hard logic or in the programmable resources. The degree to which the reconfiguration monitoring circuitry and software should run on programmable resources or hardwired function blocks of an integrated circuit device may be determined based upon various factors. As adoption of a standard interface for implementing a monitor/debug port becomes more established and confidence in the maturity of the interface and application programming interfaces (APIs) necessary to implement the interface grows, more dedicated hardware support is likely. Because there is an inherent trade-off in the overhead of debug circuitry if implemented in programmable resources, it may be more efficient to implement the monitoring circuits in fixed hardware.

With a greater adoption of dynamically reconfigurable designs, their inherent additional complexity must be offset by the development of more sophisticated support tools not just for use in a circuit design, but also for use after a circuit design is implemented. By adopting a standardized debug interface at the physical and logical levels, much of the work of implementing debug capabilities can be automated. Design properties, such as information related to various tasks, can be extracted from the specification and the necessary circuits and/or software can be synthesized automatically Turning now to FIG. 3, a block diagram of a system implementing the device having programmable resources of FIG. 2 is shown. A circuit board 302 comprises a number of devices which are coupled either by direct connections or buses. According to the example of FIG. 3, the integrated circuit device 110 having programmable resources may be coupled to any number of the other devices on the circuit board by way of direct connections between the integrated circuit device 110 and other devices, or by way of buses. An example of the integrated circuit device 110 will be described in more detail in reference to FIGS. 4 and 5. Configuration bits for configuring the programmable resources may be loaded in the integrated circuit device 110 by way of a non-volatile memory 306. The circuit board may also comprise a microprocessor 308, a random access memory (RAM) 310, a programmable read only memory (PROM) 312, and another integrated circuit 314 or component 316. The devices may be connected by direct interconnects implemented using conductive traces on the board, as is well known. Examples of such direct interconnects are shown as interconnects 318.

An interconnect 320 from the device 110 to other devices on the circuit board is designated to provide a "DONE" signal generated at the I/O port 118 of the device 110 to indicate that the configuration bits have been fully loaded into the device. While the DONE signal is shown being routed to the devices of the circuit board using interconnect 320, it should be understood that the DONE signal could be routed to the predetermined devices using other means, such as separate direct connections to one or more of the other devices. While FIG. 3 is provided to describe the interaction of devices on a circuit board, it should be understood that other devices could be employed on the circuit board, or coupled to communicate according to different means. As will be described in more detail below, reconfiguration status signals provided by way of the I/O port 118 implemented as a monitor/debug port will provide information related to the status of the reconfiguration operation.

Figure 4:
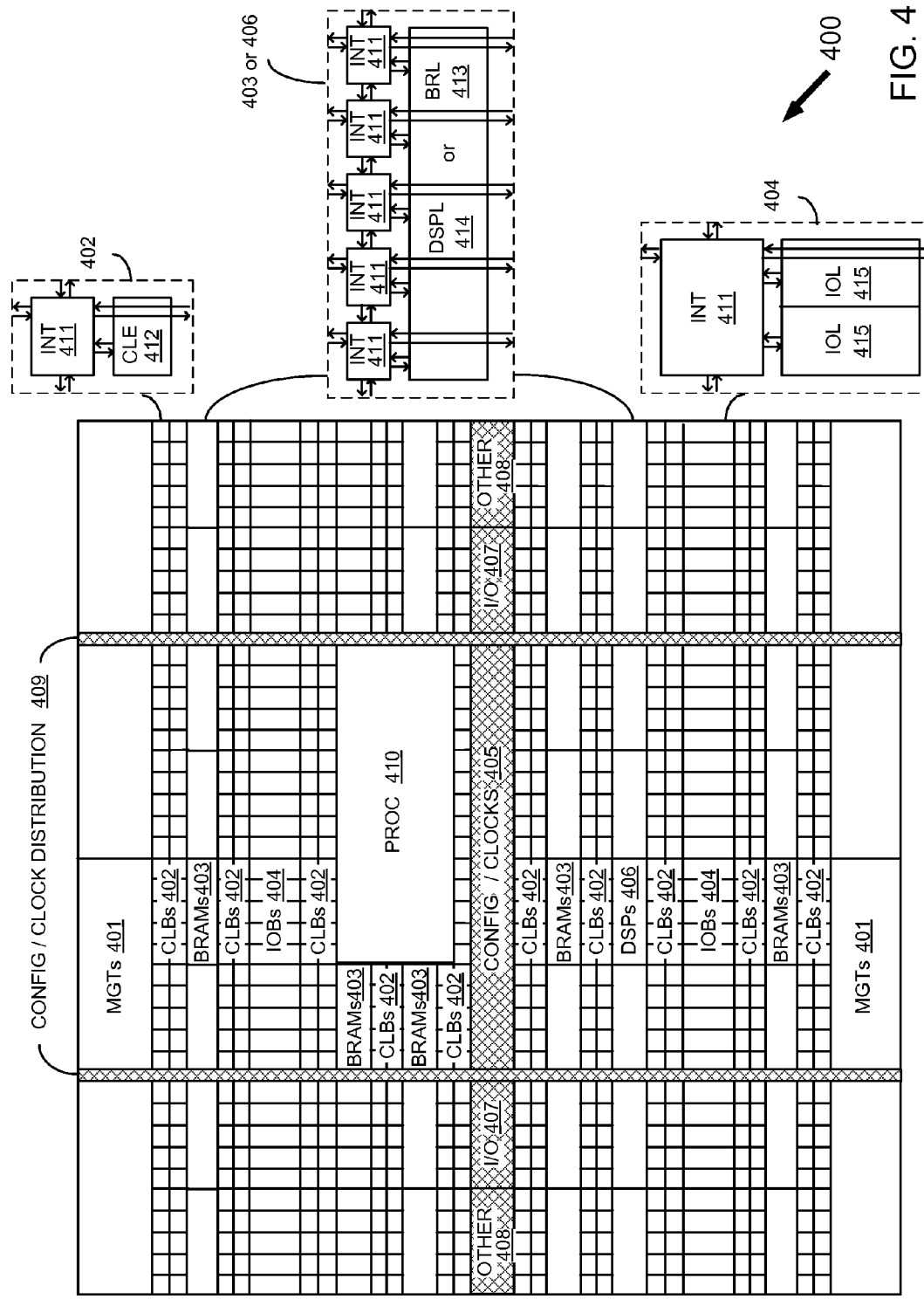
FIG. 4 is a block diagram of a device having programmable resources according to an alternate embodiment.

Turning now to FIG. 4, a block diagram of a device having programmable resources according to an alternate embodiment is shown. While programmable resources may be implemented in any type of integrated circuit, such as an ASIC having programmable resources, other devices comprise substantial portions of programmable resources. A Complex Programmable Logic Device (CPLD) is one type of PLD which includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

The device of FIG. 4 comprises an FPGA architecture 400 having a large number of different programmable resources implemented as programmable tiles, including multi-gigabit transceivers (MGTs) 401, CLBs 402, random access memory blocks (BRAMs) 403, IOBs 404, configuration and clocking logic (CONFIG/CLOCKS) 405, digital signal processing blocks (DSPs) 406, specialized input/output blocks (I/O) 407 (e.g., configuration ports and clock ports), and other programmable logic 408 such as digital clock managers, analog-to-digital converters, system monitoring logic, and so forth. Some FPGAs also include dedicated processor blocks (PROC) 410, which may be used to implement a software application, for example.

In some FPGAs, each programmable tile includes a programmable interconnect element (INT) 411 having standardized connections to and from a corresponding interconnect element in each adjacent tile. Therefore, the programmable interconnect elements taken together implement the programmable interconnect structure for the illustrated FPGA. The programmable interconnect element 411 also includes the connections to and from the programmable logic element within the same tile, as shown by the examples included in FIG. 4.

For example, a CLB 402 may include a configurable logic element (CLE) 412 that may be programmed to implement user logic plus a single programmable interconnect element 411. A BRAM 403 may include a BRAM logic element (BRL) 413 in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 406 may include a DSP logic element (DSPL) 414 in addition to an appropriate number of programmable interconnect elements. An IOB 404 may include, for example, two instances of an input/output logic element (IOL) 415 in addition to one instance of the programmable interconnect element 411. The location of connections of the device is controlled by configuration data bits of a configuration bitstream provided to the device for that purpose. The bitstream is either downloaded by way of a cable or programmed into an EPROM for delivery to the programmable integrated circuit. The bitstream can be viewed as an alternate image of the device shown in FIG. 4, for example. That is, underneath the arrangement of elements of FIG. 4 is a separate bit framework forming the connections, filling the CLBs and BRAMS, as well as various registers within DCMs, multipliers, and MGTs, for example. This bit framework, and the configuration of the bit framework, will be described in detail in FIG. 6. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a horizontal area near the center of the die is used for configuration, clock, and other control logic. Vertical areas 409 extending from this column are used to distribute the clocks and configuration signals across the breadth of the FPGA. Some FPGAs utilizing the architecture illustrated in FIG. 4 include additional logic blocks that disrupt the regular columnar structure making up a large part of the FPGA. The additional logic blocks may be programmable blocks and/or dedicated logic. For example, the processor block PROC 410 shown in FIG. 4 spans several rows of CLBs and BRAMs.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic.

Figure 5:
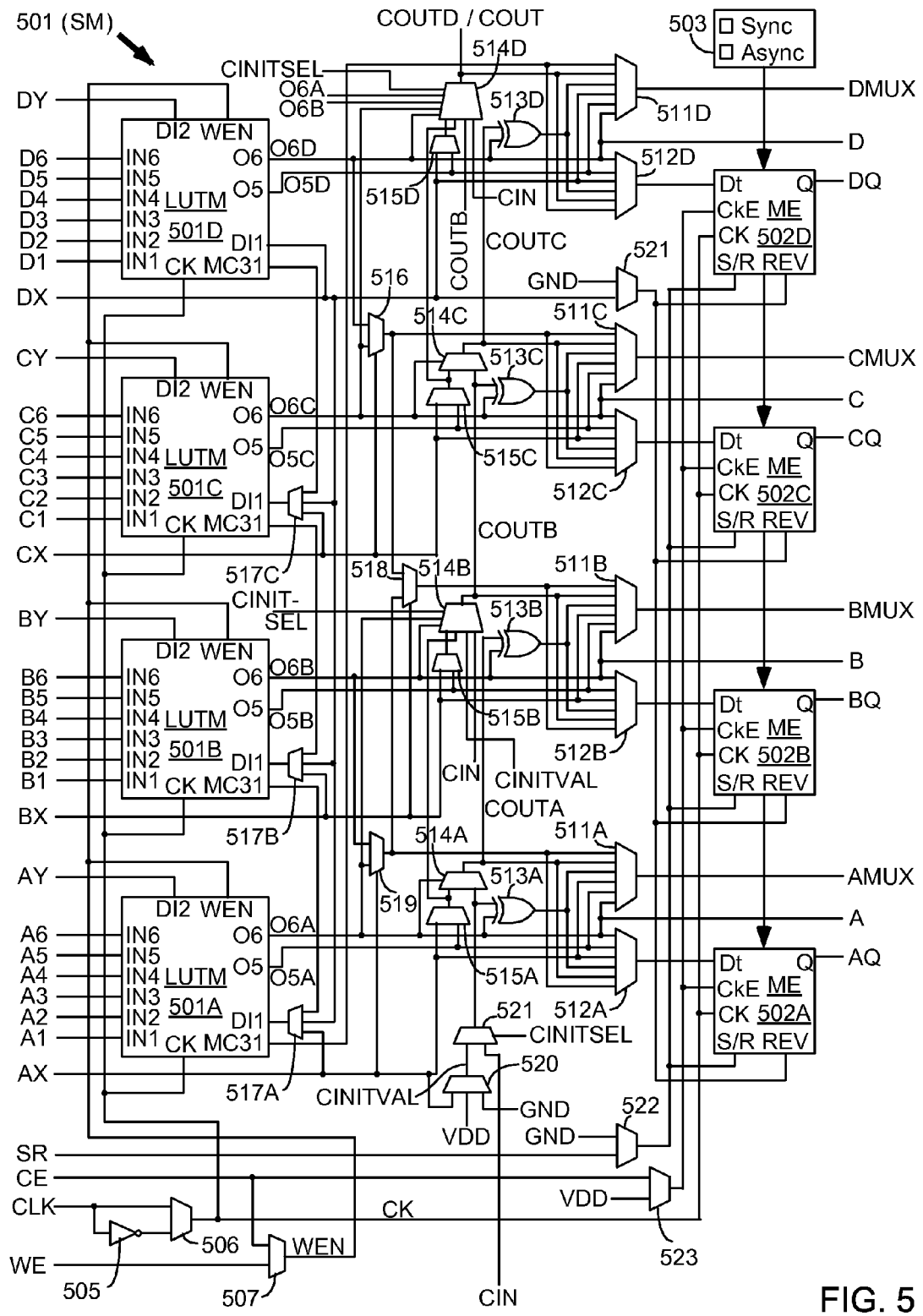
FIG. 5 is a block diagram of a configurable logic element of the device having programmable resources of FIG. 4 according to an embodiment.

Turning now to FIG. 5, a block diagram of a configurable logic element of the device of FIG. 4 according to an embodiment is shown. In particular, FIG. 5 illustrates in simplified form a configurable logic element of a configuration logic block 402 of FIG. 4. In the embodiment of FIG. 5, slice M 500 includes four lookup tables (LUTMs) 501A-501D, each driven by six LUT data input terminals A1-A6, B1-B6, C1-C6, and D1-D6 and each providing two LUT output signals O5 and O6. The O6 output terminals from LUTs 501A-501D drive slice output terminals A-D, respectively. The LUT data input signals are supplied by the FPGA interconnect structure via input multiplexers, which may be implemented by programmable interconnect element 511, and the LUT output signals are also supplied to the interconnect structure. Slice M also includes: output select multiplexers 511A-511D driving output terminals AMUX-DMUX; multiplexers 512A-512D driving the data input terminals of memory elements 502A-502D; combinational multiplexers 516, 518, and 519; bounce multiplexer circuits 522-523; a circuit represented by inverter 505 and multiplexer 506 (which together provide an optional inversion on the input clock path); and carry logic comprising multiplexers 514A-514D, 515A-515D, 520-521 and exclusive OR gates 513A-513D. All of these elements are coupled together as shown in FIG. 5. Where select inputs are not shown for the multiplexers illustrated in FIG. 5, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 5 for clarity, as well as from other selected figures herein.

In the pictured embodiment, each memory element 502A-502D may be programmed to function as a synchronous or asynchronous flip-flop or latch. The selection between synchronous and asynchronous functionality is made for all four memory elements in a slice by programming Sync/Asynch selection circuit 503. When a memory element is programmed so that the S/R (set/reset) input signal provides a set function, the REV input terminal provides the reset function.

When the memory element is programmed so that the S/R input signal provides a reset function, the REV input terminal provides the set function. Memory elements 502A-502D are clocked by a clock signal CK, which may be provided by a global clock network or by the interconnect structure, for example. Such programmable memory elements are well known in the art of FPGA design. Each memory element 502A-502D provides a registered output signal AQ-DQ to the interconnect structure. Because each LUT 501A-501D provides two output signals, O5 and O6, the LUT may be configured to function as two 5-input LUTs with five shared input signals (IN1-IN5), or as one 6-input LUT having input signals IN1-IN6.

In the embodiment of FIG. 5, each LUTM 501A-501D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 517A-517C for LUTs 501A-501C), or to the two 32-bit RAMs via input terminals DI1 and DI2. RAM write operations in the LUT RAMs are controlled by clock signal CK from multiplexer 506 and by write enable signal WEN from multiplexer 507, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 501A may also be provided to the general interconnect structure for shift register chaining, via output select multiplexer 511D and CLE output terminal DMUX. The devices having programmable resources and methods described may be implemented according to the device of FIGS. 4 and 5, or in any device, including any type of integrated circuit, having programmable resources used to implement at least a portion of a circuit design.

Figure 6:
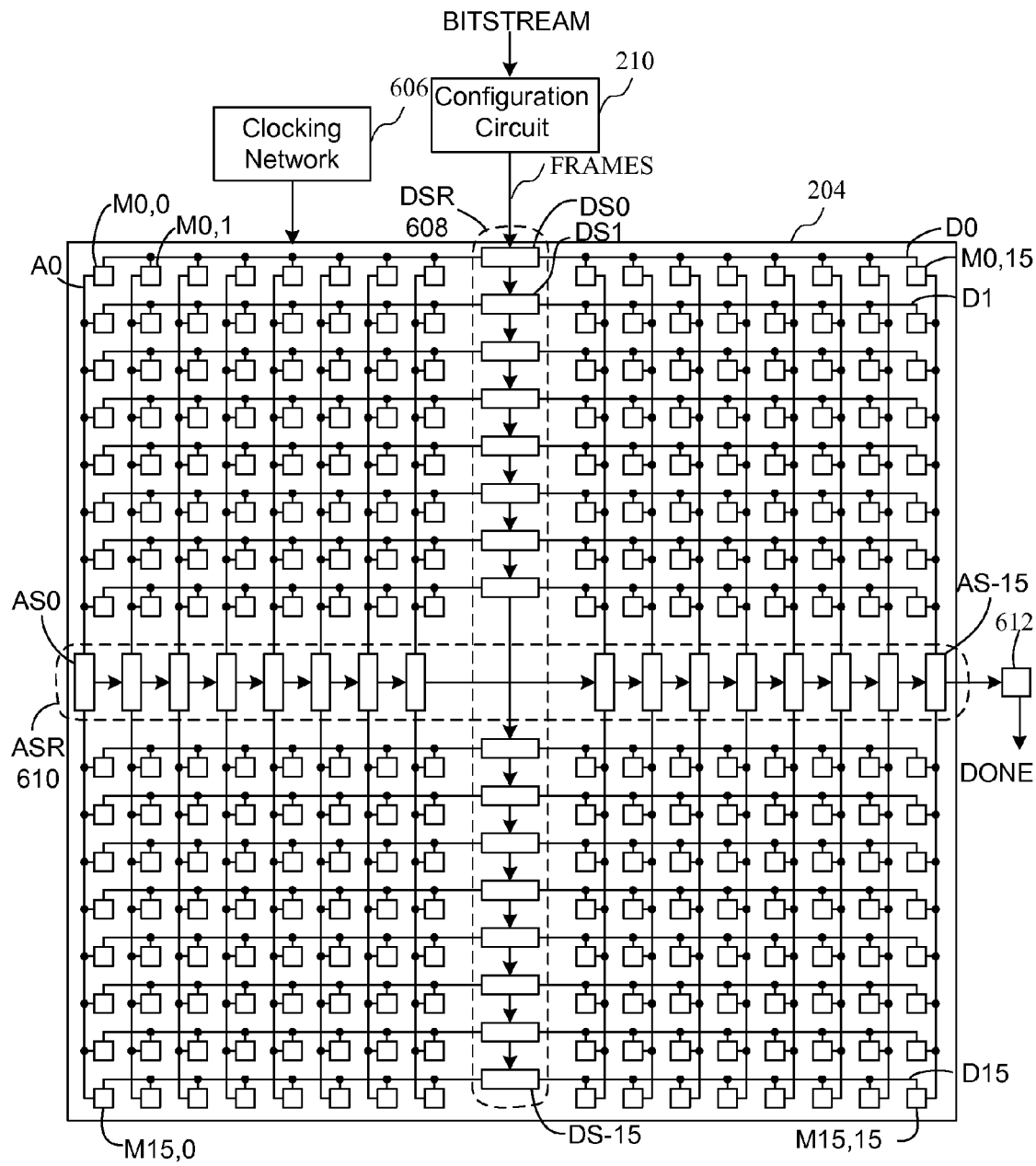
FIG. 6 is a block diagram of a circuit enabling the configuration of a device having programmable resources according to an embodiment.

Turning now to FIG. 6, a block diagram of a circuit enabling the configuration of a device having programmable resources according to an embodiment is shown. The circuit of FIG. 6 generally comprises the configuration circuit 210 and the configuration memory 204 coupled to receive the configuration bits of a configuration bitstream. The configuration circuit 210 receives the bitstream, and disperses frames of configuration bits of the bitstream to various configuration memory cells according to a predetermined protocol using a clocking network 606. The configuration circuit 210 enables loading the configuration bitstream by way of a central data shift register (DSR) 608. DSR 608 is a length of a frame, which will be the fundamental data item transferred. As shown in FIG. 6, the DSR 608, which is connected in parallel to all cells of the configuration memory, captures a frame. The DSR 608 outputs connect to the parallel inputs of the various configuration memory cells in the rows. The configuration process is simply extracting frames of data from the incoming bitstream, identifying the correct columns to receive the frames, dispatch them until all of the frames have been loaded.

The configuration memory 204 of FIG. 6 is shown by way of example as a 16-bit by 16-bit array, which includes 256 configuration memory cells. In general, each of the configuration memory cells is identified by a reference character Mx,y, where x and y correspond to the row and column, respectively, of the configuration memory cell. An array of configuration memory cells in a typical device has on the order of millions of memory cells. Therefore, the array of FIG. 6 is much smaller than is typically used, but nevertheless shows the structure of a configuration memory which could be employed according to the various embodiments.

To load configuration data into the configuration memory 204, the configuration bitstream is shifted through the DSR 608 under control of the clocking network 606 until a 16 bit wide frame of data has been shifted into bit positions DS0 through DS15 of the DSR 608. The frame of data is then shifted in parallel on data lines D0 through D15 into a column of configuration memory cells addressed by address shift register (ASR) 610. The column may be addressed, for example, by shifting a token high bit through the ASR 610 to the desired column. As set forth above, frames of configuration data associated with I/O ports are loaded first, enabling the integrated circuit to generate output signals at output ports before the entire configuration bitstream is loaded. When all of the frames have been loaded, a circuit 612 is activated to generate the DONE signal. The DSR 608 and ASR 610 which are shown circled in dashed lines and the circuit 612 may be a part of the configuration circuit 210. An example of a configuration circuit 210 which could be implemented according to the various embodiments is shown and described in FIG. 4 of U.S. Pat. No. 6,429,682, the entire patent of which is incorporate by reference herein.

Figure 7:
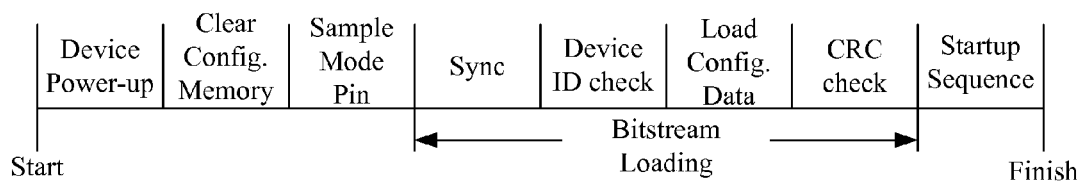
FIG. 7 is a diagram showing stages of programming a device having programmable resources according to an embodiment.

While a circuit for loading a configuration bitstream and the general operation of a loading a configuration bitstream has been shown and described in reference to FIG. 6, a more detailed operation of loading a configuration bitstream will be described in reference to FIG. 7. The diagram of FIG. 7 summarizes stages of programming an integrated circuit having programmable resources. At power up, the various configuration cells and state machines are not capable of correct electronic action until sufficient voltage and current are available from external power regulators. Depending on the integrated circuit, the precise voltages will be different for the various activities. In general, there is a recognition voltage where internal state machines trigger and take appropriate action. Once the proper voltage arrives, a state machine triggers and the configuration circuit automatically cycles through its address space of configuration frames, writing zeroes into all the memory cells during a power-on reset (POR). Zeroing the memory cells eliminates the possibility of internal contention, which might damage the integrated circuit. Zeroing the memory cells may be performed twice to assure proper initialization. After zeroing the memory cells of the configuration memory, the configuration memory samples mode pins to continue the configuration process according to a selected mode of configuration.

The configuration bitstream includes a synchronization word to guarantee correct reading of the synchronization data at a previously specified clock period. If synchronization word is read correctly, it is necessary to ensure that the bits which follow are for the receiving integrated circuit. Therefore, a device ID is next checked. For example, the device ID may be checked against an ID stored in the programmable integrated circuit. The ID may be specific to a specific device, a type of device, or even a family of devices. Because frame sizes and bit arrangements may vary among different devices in a family of devices, this check is critical to ensure that data frames are not inadvertently loaded into the wrong device.

Figure 8:
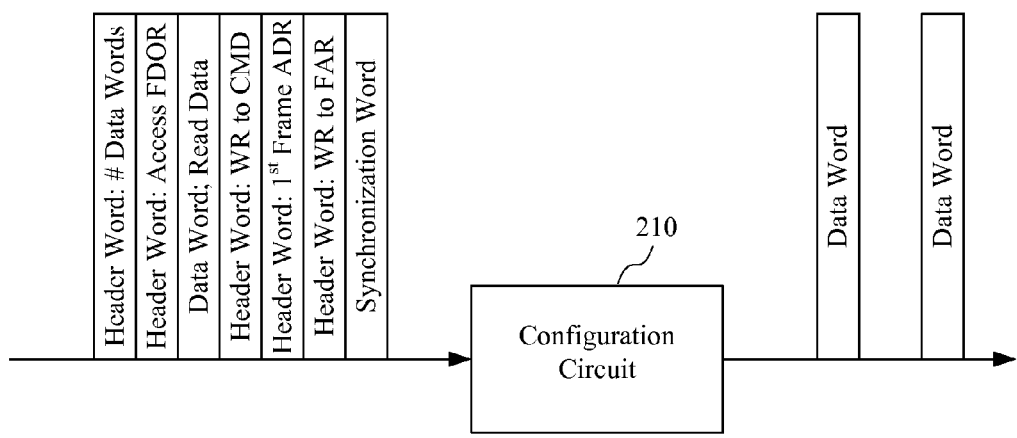
FIG. 8 is a diagram showing the generation of data words from a configuration bitstream according to an embodiment.

Assuming synchronization and device ID check are satisfied, the configuration payload is then loaded. The configuration payload bits include not only the configuration data (e.g. the bits which are used to configure CLBs, BRAMs, etc.), but also instructions and parameters for a set of specific actions that the configuration circuit must take to load the configuration data. As shown in FIG. 8, both control words and data words are provided in the configuration payload to enable the correct loading of the frames of data in the configuration memory 204. According to aspects of the various embodiments, the control words and data words of the configuration payload will be arranged to load the configuration data for the I/O ports first, as set forth above. Through the duration of bitstream delivery, a CRC state machine within the integrated circuit tallies a finite field calculation that is unique for the delivered bitstream, and serves as a signature at the end of the process. At the end of the bitstream delivery, the integrated circuit calculated CRC value must match the one appended to the bitstream at the end of the process, or an error condition is flagged into an configuration controller error register. If the CRC values match, an active high DONE signal is generated to indicate that all of the configuration bits have been successfully loaded.

Figure 9:
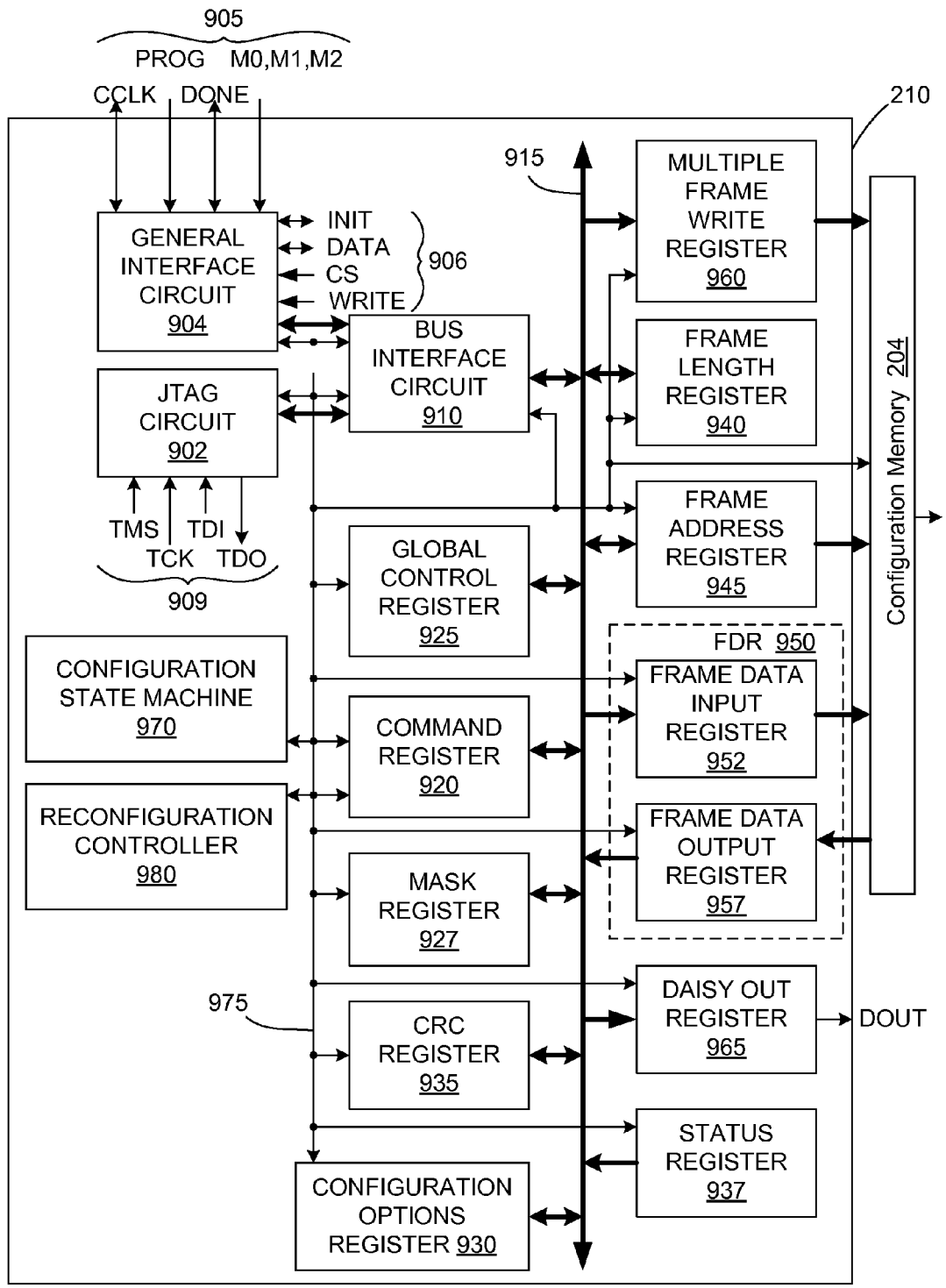
FIG. 9 is a block diagram of a configuration circuit according to an embodiment.

Turning now to FIG. 9, a block diagram of a configuration circuit according to an embodiment is shown. The configuration circuit 210 that includes a configuration bus structure and a collection of 32-bit registers (referred to herein as the configuration registers) for accessing and controlling programmable resources, such as the various programmable blocks described in reference to FIG. 4. These configuration registers are accessed through JTAG circuit 902 and/or a general interface circuit 904 that are respectively connected to a bus interface circuit 910. Bus interface circuit 910 is connected between general interface circuit 904 and a common 32-line parallel bus 915. The configuration registers are also connected to bus 915 and include a command register 920, a global control register 925, a mask register 927, a configuration options register 930, a cyclic redundancy check (CRC) register 935, a status register 937, a frame length register 940, a frame address register 945, a frame data register (FDR) 950, a multiple frame write register 960, and a daisy out register 965. In one embodiment, FDR 950 includes both a frame data input register 952 and a frame data output register 957. A configuration state machine 970 is provided to coordinate the configuration registers and configuration memory 204 during the configuration and readback operations. Communication between the interface circuits, configuration registers, configuration state machine 970, and configuration memory 204 is carried out over a conductive network 975. Details and functions of configuration circuit 210 are described in the following paragraphs.

There are two interface circuits provided on the integrated circuit: one is provided by JTAG circuit 902, the other by general interface circuit 904. Additional interface circuits may be incorporated onto the integrated circuit to provide additional paths for communicating with configuration memory 204.

JTAG circuit 902 is substantially defined by IEEE Standard 1149.1, which is well known. This standard includes provisions for special-purpose Boundary-Scan registers that perform functions such as in-system programming (ISP). JTAG circuit 902 includes such a special-purpose register (not shown) that performs the data processing functions described below with respect to general interface circuit 904. In particular, this special-purpose register is responsive to command, clock and data signals transmitted on JTAG pins 909 (TDI, TDO, TCK, and TMS) to transmit data signals to and receive signals from bus interface circuit 910. Note that when JTAG circuit 902 is utilized for configuration and readback operations, dual-purpose pins 906 (INIT, DATA, CS, and WRITE) are not utilized by general interface circuit 904. However, dedicated pins 905, such as CCLK, PROG, DONE, M0, M1, M2, pass their respective control signals to configuration circuit 210 when configuration/readback operations are performed through either JTAG circuit 902 or dual-purpose pins of general interface circuit 904.

In one embodiment, general interface circuit 904 includes a 32-bit shift register and control circuitry for coordinating data transmissions between dual-purpose pins 906 and bus interface circuit 910. During configuration operations, one DATA terminal is utilized for serial bit stream transmissions. Alternatively, eight DATA terminals are utilized for 8-bit parallel bit stream transmissions, and so forth. During configuration operations, upon receiving each 32-bit word of the bit stream, general interface circuit 904 transmits a write (WR) signal to bus interface circuit 910, and then transmits the 32-bit word in parallel to bus interface circuit 910 upon receiving authorization. This data transmission process is described in further detail below.

The following paragraphs describe configuration registers connected to bus 915 in accordance with the embodiment shown in FIG. 9. Because common bus 915 is utilized to transmit both configuration commands and configuration data, an almost unlimited number of registers can be connected to bus 915. Therefore, the following list is not intended to be exhaustive.

Configuration operation commands are loaded from the bit stream into command register 920 via bus 915 to control the operation of the configuration state machine 970. Each configuration command is identified by a predefined binary code (the opcode). The configuration command stored in command register 920 is executed on the next clock cycle after it is transmitted from packet processor 912. Examples of commands and their effect on configuration circuit 210 are discussed in the following paragraphs. Of course, because each command is identified by a binary code, an almost unlimited number of specialized commands can be controlled through command register 920 from the bit stream.

A write configuration data command is loaded into command register 920 prior to writing configuration data to frame data input register 952 of FDR 950. This command causes configuration state machine 970 to cycle through a sequence of states that control the shifting of FDR 950 and the writing of the configuration data into configuration memory 204.

When operation of the integrated circuit is suspended, a last frame command is loaded into command register 920 prior to writing a last data frame of a configuration operation. As discussed below, when operation of the integrated circuit is suspended, a special global high (G-High) signal is utilized to prevent signal contention. The last frame command is not necessary when, for example, partial reconfiguration is performed without suspending operation of the integrated circuit (i.e., the G-High signal is not asserted). The last frame command allows overlap of the last frame write operation with the release of the G-High signal.

A read configuration data command is loaded into command register 920 prior to reading frame data from frame data output register 957 of FDR 950. This command is similar to the write configuration data command in its effect on FDR 950.

A begin start-up sequence command is loaded into command register 920 to initiate the start-up sequence. This command is also used to start a shutdown sequence prior to some partial reconfiguration operations. The start-up sequence begins with the next successful CRC check.

A reset command is loaded into command register 920 to reset, for example, CRC register 935 in the event of an error condition. This command is used mainly for testing or troubleshooting.

An assert G-high signal command is used prior to configuration or reconfiguration operations to prevent signal contention while writing new configuration data. In response to the assert G-High signal command, all CLBs of the integrated circuit are controlled to generate high signals at their output terminals.

A switch configuration clock (CCLK) frequency command is used to change the frequency of the master CCLK. The new frequency is specified in configuration option data written to configuration options register (COR) 930 (discussed below) prior to executing the switch configuration clock frequency command.

Global control register 925 stores control data received from the bit stream that controls internal functions of the integrated circuit, and operates in conjunction with configuration option data written to configuration options register 930 (discussed below). Examples of control option fields within global control register 925 and their effect on configuration circuit 210 are discussed in the following paragraphs. Of course, because each control option is identified by a binary code, an almost unlimited number of specialized functions can be controlled through global control register 925 from the bit stream. Therefore, the following list is not intended to be exhaustive.

A persist control option causes dual-purpose pins 906 to retain their connection with configuration circuit 210 even after initial configuration of the integrated circuit is completed. When the persist control data loaded into global control register 925 is in its default setting, then all dual-purpose pins 906 become user I/O after configuration. Note that dedicated configuration pins 905 CCLK, PROG, DONE, and mode control pins M0, M1 and M2 are not affected by the persist control option. In addition, the persist control option does not affect Boundary Scan operations through JTAG circuit 902.

A security control option selectively restricts access to configuration and read operations. If the persist control option (discussed above) is not utilized, then dual-access pins 906 are not available after configuration; however, the Boundary Scan pins 909 are always active and have access to programmable resources. To prevent unauthorized access of programmable resources through these pins (or through dual-access pins 906 when the persist control option is selected), security control option data is stored in global control register 925 that controls state machine 970 to selectively disable all read functions from dual-access pins 906 and/or Boundary Scan pins 909.

Mask register 927 is used to prevent undesirable control data signal transmissions from bus 915 to, for example, global control register 925. Mask register 927 stores authorization data that controls switches located between bus 915 and the memory cells of, for example, global control register 925. Each data bit stored by mask register 927 controls an associated switch, thereby controlling the transmission of data to an associated memory cell of global control register 925.

Configuration options register 930 is used to store configuration options data that is used to control the start-up sequence (discussed below) of the integrated circuit at the end of a configuration operation. Examples of the types of data stored in various fields (i.e., groups of bit locations) of configuration options register 930 and their effect on the start-up sequence are discussed in the following paragraphs. Of course, because each configuration option is identified by a binary code, additional options can be controlled through configuration options register 930. Therefore, the following list is not intended to be exhaustive.

A ConfigRate field of configuration options register 930 stores data bits that control the internally generated frequency of the configuration clock CCLK during some configuration operations.

A StartupClk field of Configuration options register 930 identifies a clock source to synchronize the start-up sequence (discussed below) of the integrated circuit. The default is the configuration clock CCLK, which is standard for most configuration schemes. However, in some instances, it is desirable to synchronize the start-up sequence to another clock source.

Configuration options register 930 also includes a group of fields that are used to define which cycles of the start-up sequence will release certain internal signals. For example, a GSR_cycle field stores data that controls the release of a global set/reset (GSR) signal, which is selectively used, for example, to hold all internal CLB flip-flops in their configured initial state. A GTS_cycle field stores data that controls the release of a global tri-state (GTS) signal, which is selectively used to disable all CLB outputs. A GWE_cycle field stores data that controls the release of a global write enable (GWE) signal, which is used to prevent all flip-flops, Block RAM, and LUT memory cells from changing state. A LCK_cycle field stores data that controls which state the start-up sequence maintains until the delay-locked loop (DLL) has established a lock. Finally, a DONE_cycle field stores data that specifies which clock cycle of the start-up sequence releases the DONE pin.

Cyclic redundancy check (CRC) register 935 is used to detect errors during the transmission of data/command words to selected registers connected to bus 915. Specifically, using the data transmitted on bus 915, CRC register 935 calculates a check-sum value in accordance with a predetermined equation (described below). At any time during the transmission (e.g., halfway through configuration or at the end of configuration), a pre-calculated check-sum value is transmitted to CRC register 935 that represents an expected check-sum value at the selected time. The pre-calculated check-sum value is then compared with the check-sum value currently stored in CRC register 935. If the pre-calculated check-sum value does not equal the current check-sum value, then an error signal is generated that notifies a user that a transmission error has occurred. Therefore, CRC register 935 facilitates transmission error detection at any time during the transmission of configuration data on bus 915.

Status register 937 is loaded with current values of the various control and/or status signals utilized in configuration circuit 210. These signals include the DONE signal that indicates the completion of a configuration operation, the INIT signal that is used to initiate configuration operations, the mode values M0, M1 and M2 that indicate the current configuration mode, and the state of the global control and error signals discussed above. Status register 937 can be read during reconfiguration through general interface circuit 904 or JTAG circuit 902 via bus 915.

Frame length register 940 stores data indicating the length of each frame (e.g., the number of 32-bit words in each frame, rounded up to the next highest integer) in configuration memory 204. The frame length value is transmitted near the beginning of the configuration bit stream, and is used by configuration state machine 970 to provide sequencing information for the configuration read and write operations.

Because frame length register 940 stores a frame length value that controls configuration read and write operations, configuration circuit 210 can be incorporated without modification into FPGAs having frames of any length that can be stored in the register.

During configuration operations, frame address register 945 holds the address of the frame being written at a given point in the operation. Similarly, during readback operations, frame address register 945 holds the address of the frame currently being read. The address is divided into four parts that are stored in various fields of frame address register 945. A block type field stores data indicating whether a CLB, IOB or Block RAM frame is being configured or read. A major address field stores the major address of the frame being configured or read, a minor address field stores the minor address of the frame, and a byte field stores the byte being addressed. As discussed above, the major address field indicates the column in which the addressed frame resides, and the minor address field indicates the frame within the column. In one embodiment, the minor address field is incremented each time a full data frame is read from or written to frame data register 950. If the last frame within the CLB column is selected when the increment occurs, the major address field is incremented and the minor address field is reset to zero, otherwise the minor address is incremented.

Frame data input register 952 makes up a first part of frame data register 950, and is a shift register into which data is loaded prior to transfer to configuration memory 204. Configuration frame data is written to configuration memory 204 by loading command register 920 with the write configuration data command, thereby initiating associated operations of state machine 970. A subsequent header word(s) includes the address of frame data input register 952 and the number of 32-bit words to be written into configuration memory 204. In response to this header word(s), packet processor 912 transmits a register enable signal that enables frame data input register 952 to receive 32-bit configuration frame data words from bus 915. A sequence of 32-bit configuration frame data words are then written to frame data input register 952. As discussed in additional detail below, the write operation is pipelined such that a first frame of data is written to configuration memory 204 while a second frame is being shifted in. In one embodiment, the last frame (the pad frame) written to configuration memory 204 includes dummy data that is not actually written to memory cells.

Frame data output register 957 makes up a second part of frame data register 950, and is also a shift register into which data is loaded from configuration memory 204 prior to transfer through bus interface circuit 910 to a selected device pin (i.e., either through general interface circuit 904 or JTAG circuit 902). Frame data output register 957 is used during readback operations. Readback operations are performed by loading command register 920 with the read configuration data command and then addressing frame data output register 957 with a read command.

Multiple frame write register 960 is provided for instances when a common data frame is written into two or more frames of configuration memory 204. As described in additional detail below, once a data frame is written into a shift register of configuration memory 204, the data frame can be sequentially written to multiple frames by sequentially changing the frame address transmitted to frame address register 945. In one embodiment, multiple frame write register 960 is a not a physical device, but is provided a "dummy" address. When multiple frame write register 960 is addressed in the bit stream, the subsequently transmitted data bits are ignored by all registers. However, because fewer clock cycles are typically needed to write the common data frame into memory array than are needed to transmit one frame of data into frame data input register 952, the use of multiple frame write register 960 reduces the amount of data in the configuration bit stream, thereby shortening the configuration process and reducing the possibility of data transmission error.

Daisy Output register 965 is used for selectively daisy chaining the configuration bit stream to other PLDs when a master/slave configuration operation is performed. Data written to daisy output register 965 is serialized and applied to the DOUT pin.

Configuration state machine 970 is provided to execute various functions in response to the command words written to command register 920. Configuration state machine 970 is constructed using well-known techniques to assert predetermined control signals upon entering associated states during the execution of each function. The simplest functions require the assertion of a single control signal for one clock cycle. An example of a simple function is a "start" function that requires only one state in which a signal called "start" is asserted for one clock cycle. This signal indicates to the startup sequence block that the startup sequence should now begin. More complex functions require the sequencing of several control signals over several clock cycles. In addition, the control signals generated by configuration state machine 970 may be combined with input signals from other circuits to perform a designated function. An example of a complex function is a write configuration function that, in one embodiment, requires state machine 970 to switch between three states, control the sequencing of six control signals, and receive six input signals from other circuits to perform the function. These various states and control signals are utilized to coordinate the writing of configuration data into configuration memory 204, as described below.

Those skilled in the art understand that a state machine can be constructed in many ways to perform a particular function. If a particular function is described in sufficient detail, those skilled in the art can typically produce several state machines that perform the function. Because the various functions performed by state machine 970 are described herein, a detailed description of state machine 970 is not provided.

Figure 10:
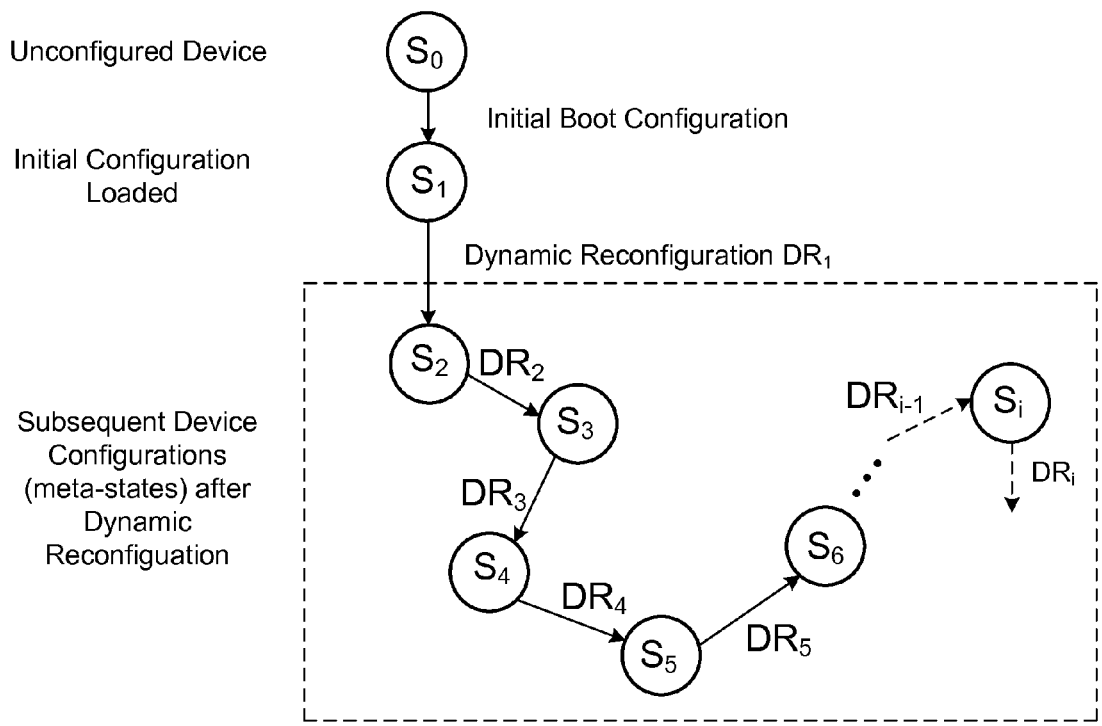
FIG. 10 is a state diagram showing the operation of the configuration circuit of FIG. 9 according to an embodiment.

Reconfiguration controller 980 enables the partial reconfiguration of programmable resources and the generation of reconfiguration status information by way of the I/O port 218. The reconfiguration controller 980 enables providing reconfiguration status information associated with the constituent states and the phase of the reconfiguration cycle of the device as set forth above. An example of providing reconfiguration status information when implementing circuits in programmable resources is described in reference to FIGS. 10-13. FIG. 10 provides an example of states of configuration, while FIGS. 12 and 13 provide examples of the configuration and reconfiguration of tasks in regions shown in FIG. 11.

Turning now to FIG. 10, a state diagram of a state machine implemented by the configuration circuit 210 is shown. After an initial boot of an unconfigured device having programmable resources at a state $S_0$ is performed to enable an initially configured device at a state $S_1$, the device may move between various device configurations or "meta-states" designated as $S_x$. Accordingly, after a first dynamic reconfiguration ($DR_1$), the device enters another meta-state $S_2$. The device may continue to be reconfigured and move between various meta-states. The output of the I/O port implemented as a monitor/debug port is monitored during the reconfiguration process to determine whether there is any erroneous behavior while in a meta-state or transitioning between metastates. During the reconfiguration process, the reconfiguration status information is provided based upon the level of feedback which is provided. As set forth above, the reconfiguration status information associated with various metastates may include information identifying what region is being reconfigured, information identifying what task or circuit is being removed and/or what task or circuit is being loaded, or the phase of a reconfiguration cycle of the integrated circuit device, for example.

By implementing the reconfiguration controller 980, it is possible to standardize the presentation and communication of the reconfiguration status via a monitor/debug port for dynamic reconfiguration. The monitor/debug port may be implemented in a hierarchical fashion to support a hierarchy of reconfigurable systems. For example, in a most basic level of a dynamic reconfiguration controller (e.g. a design adhering to a dynamic reconfiguration port protocol), the dynamic reconfiguration controller will be able to report, through the monitor/debug port when it is reconfiguring, the phases of reconfiguration (e.g. initiation, bit delivery, completion), which regions are being reconfigured, and the inter-task transition details.

Various levels of the hierarchy may be implemented based upon regions of programmable resources of the device, tasks which may be performed, and attributes of the tasks. The tasks could be any function implemented in a region of programmable resources, and may be a part of a larger function or circuit implementation. According to one embodiment, the device may have a single reconfigurable region. At a next level of the hierarchy, the device may have multiple reconfigurable regions, as will be described in FIG. 11. At another level of the hierarchy, the multiple reconfigurable regions may have prioritized tasks. At an even higher level of hierarchy, a pre-emptive system may be provided without state restoration. That is, a certain task may have priority over other tasks which are implemented in a region. When that certain task is called to be implemented in the region, it will be implemented over a task currently running task. According to this embodiment, there will be no state restoration of the currently running task which is pre-empted. That is, the pre-empted task will be implemented again from the beginning after the higher priority task is run.

According to a higher level of hierarchy, a fully pre-emptive system with state interruption and restoration is provided. That is, a pre-empted task is restored at a known interruption point and run after the higher priority task finishes. At higher levels of the protocol, much more detailed reconfiguration status information is provided, such as whether a task is being pre-empted or and whether its state is being captured for subsequent restoration. Accordingly, in addition to providing reconfiguration status information related to phases of reconfiguration and information about the constituent states, the configuration controller also enables partial reconfiguration based upon various attributes of the regions (i.e. tasks which may be performed in the various regions and restrictions related to the tasks).

The information necessary to determine the various levels of the hierarchy is provided with the configuration bitstream. That is, the configuration controller will capture information (from bits of the configuration bitstream) related to the level of partial reconfiguration information to be output by the device. The configuration controller will configure the device to implement circuits to provide that level of partial reconfiguration information. The configuration controller will also capture the information necessary to determine a priority of tasks and whether a task may be restored if it is pre-empted.

During reconfiguration, the reconfiguration controller typically controls the transition between reconfiguration states. In addition to data of a configuration bitstream used to synthesize the software and hardware necessary to communicate the reconfiguration status information to the monitor/debug port, other data is provided which will characterize a task. That is, knowledge of the original design determines how sophisticated the form of dynamic reconfiguration is used within the device. For example, information related to whether any of the reconfigurable tasks are relocatable or whether any are pre-emptible is provided with the configuration bitstream. Depending on the information provided in the configuration bitstream, the state space of the reconfigurable design expands or contracts. Consequently, the amount of reportable status information varies, and with it the amount of software and/or hardware support that will be required to implement the monitor/debug port.

According to some embodiments, error correction and encryption may apply to reconfigurable bitstreams. Therefore, state reporting will include successful ECC checks and bitstream decryption of dynamic tasks. Error flags would be generated at the monitor/debug port to indicate, for example, when a partial bitstream failed an ECC during an attempt to dynamically load the partial configuration bitstream into an array. Further, the status and debug capability are extended to include stimulus such that it would be possible for external equipment to request that a particular task be loaded in a particular region. Alternatively, the stimulus may specify a task sequence to be loaded in a given order to verify inter-task sequencing is operating as expected. In effect, the interaction between the monitor/debug port and the configuration controller is now changed so that the configuration controller may be instructed to respond to requests originating from the monitor/debug port. The device may be configured so that these requests would take precedence over the normal reconfigurable operation of the design.

Figure 11:
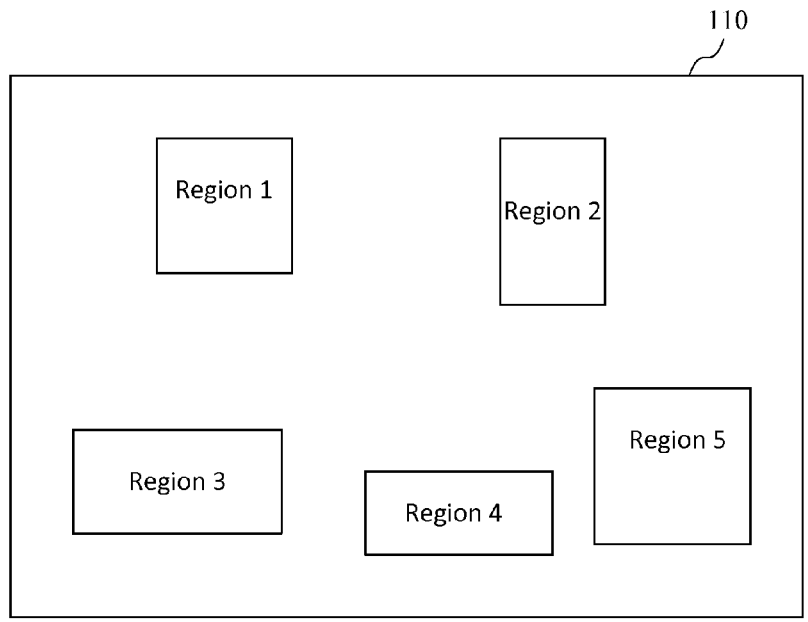
FIG. 11 is a block diagram of circuit having programmable resources associated with regions according to an embodiment.

Turning now to FIG. 11, a block diagram of circuit having programmable resources associated with regions according to an embodiment is shown. The five regions of FIG. 11 are arbitrarily shown to provide an example of certain restrictions relating to the regions and/or tasks which may apply. While five regions are shown, greater or fewer regions could be implemented according to various embodiments. As shown in the table of FIG. 12, various tasks implemented in regions according to an embodiment is shown. The region-task assignment mapping is determined at design time and stored in a dynamic reconfiguration monitor-debug block of the reconfiguration controller based upon data from the configuration bitstream. Relocatable tasks may be able to run in more than one region. Accordingly, certain task may be relocated from a first region to a second region in the event that the task must be pre-empted by another task in the region.

As shown in FIG. 12, there are 5 possible partial reconfigurable regions on the FPGA. Any valid set of task assignments to regions corresponds to one device configuration or meta-state ($S_i$) after dynamic reconfiguration. For each region, there are tasks that have been designed to run in that region.

However, there may also be dependencies between the tasks running in different regions. So when Task 1, 1 is executing in region 1, the other valid task choices for each of the remaining 4 regions are captured in the first 5 rows of the table, as shown in FIG. 13. According to the table of FIG. 13 which shows a partially associative mapping, there may be tasks which have to be performed with a task T1, 1 in Region 1. Similarly the second set of 7 rows in the table describe the valid task permutations starting with T1, 2 in Region 1. A fully associative mapping could also be implemented.

Figure 14:
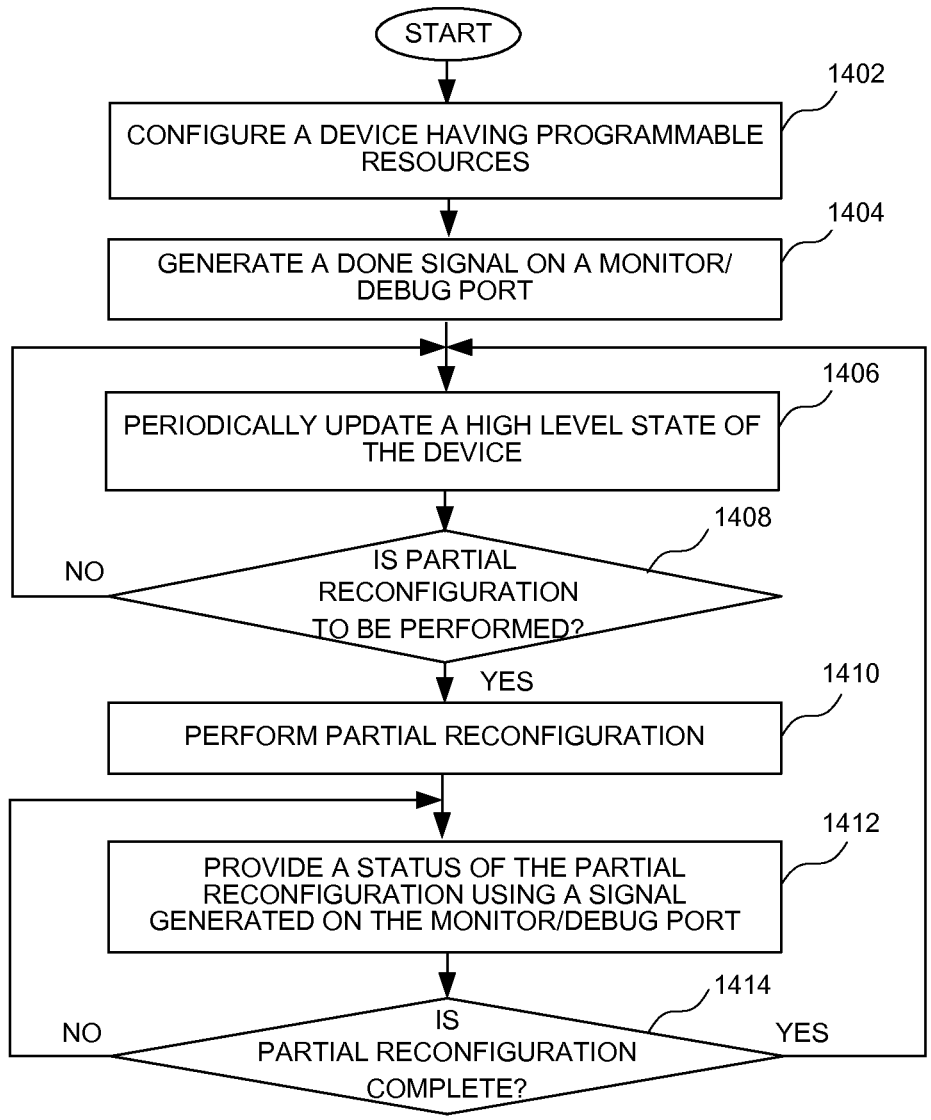
FIG. 14 is a flow chart showing a method of enabling dynamic reconfiguration of a device having programmable resources according to an embodiment.

Methods of enabling dynamic reconfiguration of a device are now described. The methods may be implemented using any of the circuits of FIGS. 1-13 as described above, or other suitable circuits. While various steps of the methods are shown, it should be understood that other steps could be implemented based upon the description of FIGS. 1-13. Turning first to FIG. 14, a flow chart shows a method of enabling dynamic reconfiguration of the device according to an embodiment. In particular, a device having programmable resources is configured at a step 1402. A done signal is generated on a monitor/debug port at a step 1404. A high level state of the device is periodically updated at a step 1406. Is partial reconfiguration to be performed at a step 1408. A partial reconfiguration performed at a step 1410. A status of the partial reconfiguration is provided using a signal generated on the monitor/debug port at a step 1412. It is then determined whether the partial reconfiguration is complete at a step 1414. If not, the partial reconfiguration continues at the step 1414, where the status of the partial reconfiguration is periodically generated. If so, a high level update of the device is performed at the step 1406, and it is again determined whether a partial reconfiguration is to be performed.

Figure 15:
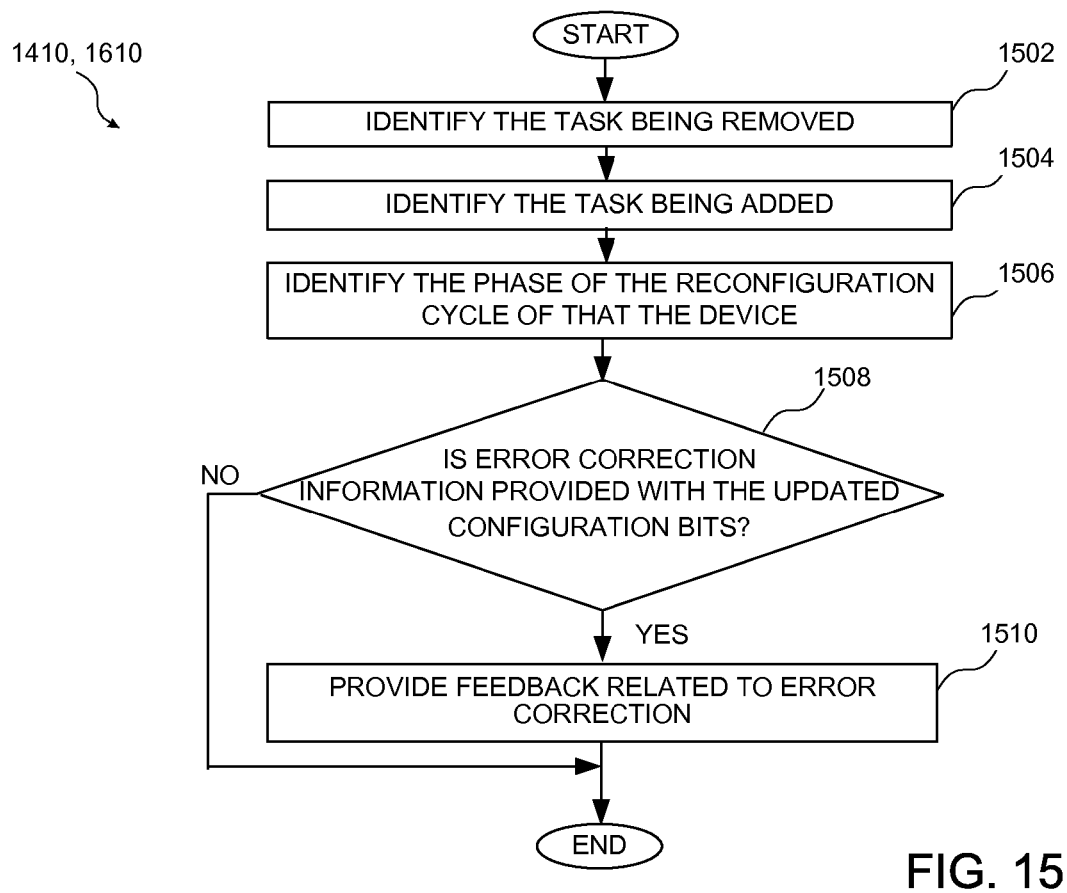
FIG. 15 is a flow chart showing a method of providing a status of partial reconfiguration of a device having programmable resources according to an embodiment.

Turning now to FIG. 15, a flow chart shows a method of providing a status of partial reconfiguration according to an embodiment. In particular, the task being removed is identified at a step 1502. The task being added is identified at a step 1504. The phase of the reconfiguration cycle that the device is in is identified at a step 1506. It is then determined whether there is error correction information provided with the reconfiguration bits at a step 1508. If so, feedback related to error correction is provided at a step 1510.

Figure 16:
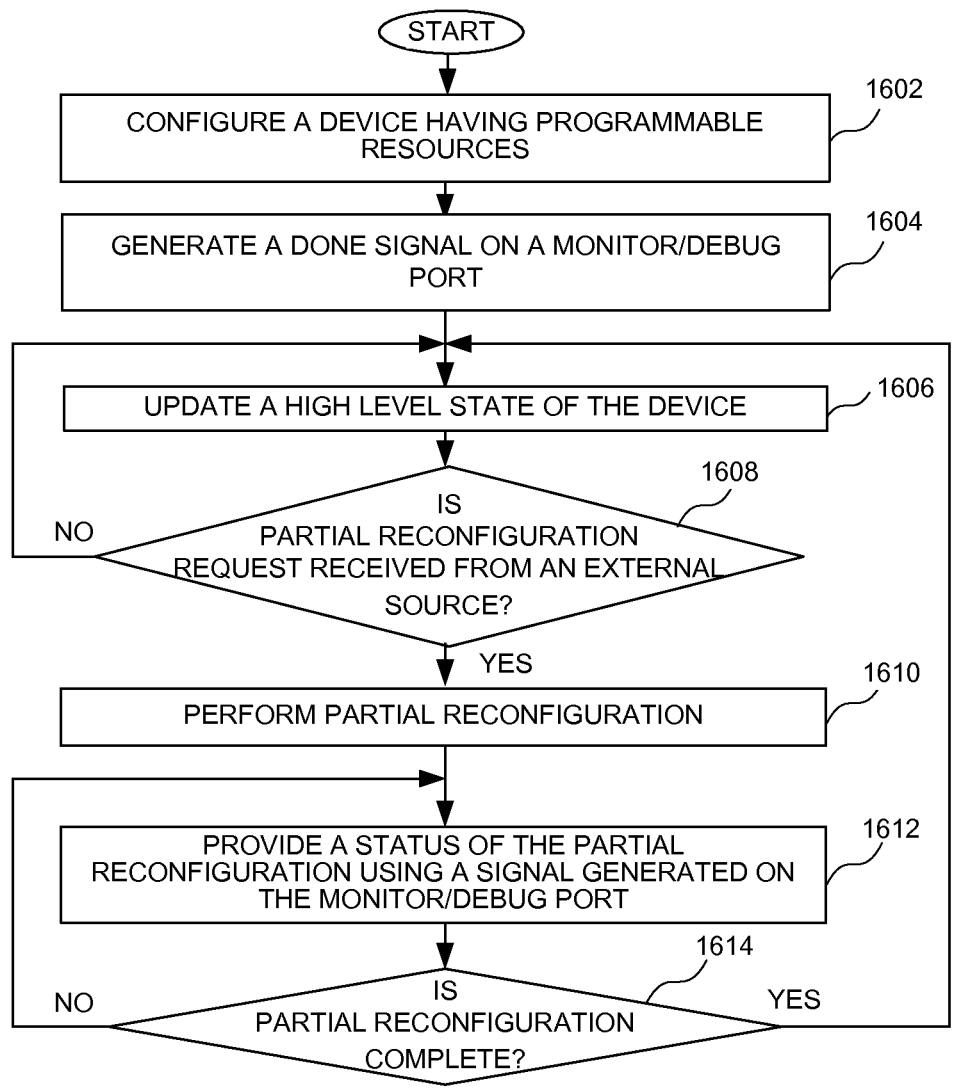
FIG. 16 is a flow chart showing a method of performing a partial reconfiguration of a device having programmable resources in response to a request from an external source according to an embodiment.

Turning now to FIG. 16, a flow chart shows a method of performing a partial reconfiguration in response to a request from an external source according to an embodiment. In particular, a device having programmable resources is configured at a step 1602. A done signal is generated on a monitor/debug port at a step 1604. A high level state of the device is periodically updated at a step 1606. A partial reconfiguration request is received from an external source at a step 1608. A partial reconfiguration is performed at a step 1610. A status of the partial reconfiguration is provided using a signal generated on the monitor/debug port at a step 1612. If not, the partial reconfiguration continues at the step 1614, where the status of the partial reconfiguration is periodically generated. If so, a high level update of the device is performed at the step 1606, and it is again determined whether a partial reconfiguration is to be performed.

It can therefore be appreciated that the new and novel method of enabling dynamic reconfiguration in a device has been described. It will be appreciated by those skilled in the art that numerous alternatives and equivalents will be seen to exist which incorporate the disclosed embodiments. As a result, the invention is not to be limited by the foregoing embodiments, but only by the following claims.

What is claimed is:

1. A method of enabling dynamic reconfiguration in a device having configurable resources, the method comprising:

receiving a configuration bitstream comprising configuration bits;

configuring the configurable resources of the device using the configuration bits of the configuration bitstream, wherein the configurable resources of the device are associated with a plurality of regions of the device, and each region has a plurality of tasks assigned to the region;

receiving a request for a partial reconfiguration of the device, wherein the partial reconfiguration is implemented according to a plurality of phases of a reconfiguration cycle;

loading updated configuration bits into memory elements associated with a region of the plurality of regions in response to the request for a partial reconfiguration, wherein a new task associated with the updated configuration bits is implemented in the region in place of a currently running task;

generating a status of the partial reconfiguration while loading the updated configuration bits, wherein the status of the partial reconfiguration includes a phase of the plurality of phases of the reconfiguration cycle; and providing, by way of a monitor port, the status external to the device.

2. The method of claim 1, wherein receiving a request for a partial reconfiguration comprises receiving a request from a circuit within the device having configurable resources or receiving a request from a device external to the device having configurable resources.

3. The method of claim 1, wherein receiving a request for a partial reconfiguration comprises receiving a request by way of the monitor port for providing the status of the partial reconfiguration.

4. The method of claim 1, wherein providing a status of the partial reconfiguration by way of a monitor port comprises providing a status of the partial reconfiguration by way of a DONE output port.

5. The method of claim 1, further comprising periodically updating the status of the partial reconfiguration.

6. The method of claim 1, further comprising identifying at least one of a task which is being removed and a task which is being added.

7. A method of enabling dynamic reconfiguration in a device having configurable resources, the method comprising:

receiving a configuration bitstream comprising configuration bits;

configuring the configurable resources of the device using the configuration bits of the configuration bitstream, wherein the configurable resources are associated with a plurality of regions of the device, and each region has a plurality of tasks assigned to the region;

receiving a request for a partial reconfiguration of the device, wherein the partial reconfiguration is implemented according to a plurality of phases of a reconfiguration cycle;

loading updated configuration bits into memory elements associated with a region of the plurality of regions in response to the request for a partial reconfiguration, wherein a new task associated with the updated configuration bits is implemented in place of a currently running task;

generating reconfiguration status information comprising at least one of the currently running task which is being removed and the new task which is being added, wherein the reconfiguration status information includes a phase of the plurality of phases of the reconfiguration cycle; and providing, by way of a monitor port, the reconfiguration status information external to the device.

8. The method of claim 7, wherein generating reconfiguration status information comprises identifying tasks associated with predetermined regions of the configurable resources which are being added.

9. The method of claim 7, further comprising extracting information from the design specification to enable synthesizing a circuit for generating the reconfiguration status information.

10. The method of claim 7, further comprising extracting information related to tasks.

11. The method of claim 7, wherein loading updated configuration bits comprises pre-empting a task with a higher priority task.

12. The method of claim 11, further comprising re-implementing the pre-empted task by re-starting the pre-empted task from a state captured while pre-empting the task.

13. An integrated circuit device having a circuit enabling dynamic reconfiguration, the integrated circuit device comprising:
    memory elements storing configuration bits;
    configurable resources associated with a plurality of regions coupled to the memory elements, the configuration bits implementing a circuit in the configurable resources, wherein each region has a plurality of tasks assigned to the region;
    a configuration circuit coupled to the memory elements, the configuration circuit enabling a partial reconfiguration of the configurable resources to implement a new task associated with updated configuration bits in place of a currently running task, wherein the partial reconfiguration is implemented according to a plurality of phases of a reconfiguration cycle; and
    a first input/output port coupled to the configuration circuit, wherein a status of the partial reconfiguration is provided external to the integrated circuit device, by the configuration circuit by way of the first input/output port, while loading updated configuration bits, wherein the status of the partial reconfiguration includes a phase of the plurality of phases of the reconfiguration cycle.

14. The integrated circuit device of claim 13, wherein a request for a partial reconfiguration is received by way of the first input/output port.

15. The integrated circuit device of claim 13, further comprising a second input/output port coupled to receive a configuration bitstream.

16. The integrated circuit device of claim 15, further comprising a third input/output port coupled to receive a reconfiguration request.

17. The integrated circuit device of claim 13, wherein the configuration circuit comprises a reconfiguration controller, the reconfiguration controller identifying the phase of the partial reconfiguration.

18. The integrated circuit device of claim 13, wherein a status of the configurable resources is provided between partial reconfigurations of the integrated circuit device.

* * * * *